(12) United States Patent
Wu et al.

(10) Patent No.: US 10,014,185 B1
(45) Date of Patent: Jul. 3, 2018

(54) SELECTIVE ETCH OF METAL NITRIDE FILMS

(71) Applicant: Applied Materials, Inc., Santa Clara, CA (US)

(72) Inventors: Liqi Wu, San Jose, CA (US); Wenyu Zhang, San Jose, CA (US); Shih Chung Chen, Cupertino, CA (US); Wei V. Tang, Santa Clara, CA (US); Leung Kway Lee, Sunnyvale, CA (US); Xinming Zhang, Santa Clara, CA (US); Paul F. Ma, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/446,573

(22) Filed: Mar. 1, 2017

(51) Int. Cl.
  *H01L 21/02* (2006.01)
  *H01L 21/311* (2006.01)
  *H01L 21/764* (2006.01)

(52) U.S. Cl.
  CPC .. *H01L 21/31122* (2013.01); *H01L 21/02183* (2013.01); *H01L 21/02186* (2013.01); *H01L 21/02244* (2013.01); *H01L 21/764* (2013.01)

(58) Field of Classification Search
  CPC ......... H01L 21/31122; H01L 21/02186; H01L 21/02183; H01L 21/02244; H01L 21/76227
  See application file for complete search history.

(56) References Cited

U.S. PATENT DOCUMENTS

| 6,774,029 B2 * | 8/2004 | Shin .................. H01L 21/28247 257/E21.3 |
| 2017/0148628 A1 * | 5/2017 | Swaminathan ... H01L 21/02123 |

* cited by examiner

*Primary Examiner* — Joseph C Nicely
*Assistant Examiner* — Pavel Ivanov
(74) *Attorney, Agent, or Firm* — Sevilla Whitney LLC

(57) ABSTRACT

Processing methods comprising oxidizing a metal nitride film to form a metal oxynitride layer and etching the metal oxynitride layer with a metal halide etchant. The metal halide etchant can be, for example, $WCl_5$, $WOCl_4$ or $TaCl_5$. Methods of filling a trench with a seam-free gapfill are also described. A metal nitride film is deposited in the trench to form a seam and pinch-off an opening of the trench. The pinched-off opening is subjected to a directional oxidizing plasma and a metal halide etchant to open the pinched-off top and allow access to the seam.

14 Claims, 2 Drawing Sheets

SELECTIVE ETCH OF METAL NITRIDE FILMS

TECHNICAL FIELD

The present disclosure relates generally to methods of etching thin films. In particular, the disclosure relates to processes for selectively etching metal nitride films for metal gate applications.

BACKGROUND

The semiconductor industry is rapidly developing chips with smaller and smaller transistor dimensions to gain more functionality per unit area. As the dimensions of devices continue to shrink, so does the gap/space between the devices, increasing the difficulty to physically isolate the devices from one another. Filling in the high aspect ratio trenches/spaces/gaps between devices which are often irregularly shaped with high-quality dielectric materials is becoming an increasing challenge to implementation with existing methods including gapfill, hardmasks and spacer applications.

Integrated circuits are made possible by processes which produce intricately patterned material layers on substrate surfaces. Producing patterned materials on a substrate requires controlled methods for removal of exposed material. Often it is useful to have an etch process which etches one material faster than another material. Such an etch process is said to be selective of the first material. As a result of the diversity of materials, circuits and processes, etch processes have been developed that selectively remove one or more of a broad range of materials.

Metal nitrides (e.g., TaN and TiN) are widely used in metal gate as high-k and n-metal capping, p-metal, or etch stop layers. In the advanced integration scheme (10 nm and beyond), it is common that both TaN and TiN are exposed on the surface before the sequential metal deposition. Those metal nitrides are oxidized after air exposure, which could impact P or N metal work function. Furthermore, in order to achieve tunable work function, it can be useful to control the thickness of the substrate TaN or TiN before metal deposition.

Therefore, there is a need in the art for new methods for selectively etching metal nitride films.

SUMMARY

One or more embodiments of the disclosure are directed to selective etch methods comprising providing a substrate having a metal nitride film thereon; exposing the metal nitride film to an oxidizing agent to form a layer of metal oxynitride on a surface of the metal nitride film; and etching the metal oxynitride layer from the surface of the metal nitride film by exposing the substrate to a metal halide etchant.

Additional embodiments of the disclosure are directed to selective etch methods. A substrate having a TiN film with a TaN film thereon is provided. The TaN film is exposed to air to form a layer of TaON on a surface of the TaN film. The layer of TaON is exposed to a metal halide etchant consisting essentially of one or more of $WCl_5$, $WOCl_4$ or $TaCl_5$ to remove the layer of TaON. Exposure to air and the metal halide etchant is repeated to remove the TaN film from the TiN film without substantially affecting the TiN film.

Further embodiments of the disclosure are directed to selective etch methods. A substrate having a trench formed in a surface of the substrate is provided. The trench has a bottom and sidewalls. A metal nitride film is deposited in the trench so that the metal nitride film grows in the trench forming a seam within the trench and metal nitride film near a top of the trench pinches off access to the seam. The metal nitride film is exposed to a directional oxidizing plasma to oxidize the metal nitride film near the top of the trench to form a metal oxynitride layer. The metal oxynitride layer is exposed to a metal halide etchant to etch the metal oxynitride layer from the metal nitride film to remove the pinch off of the trench and allow access to the seam. Additional metal nitride film is deposited in the trench to fill the seam.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
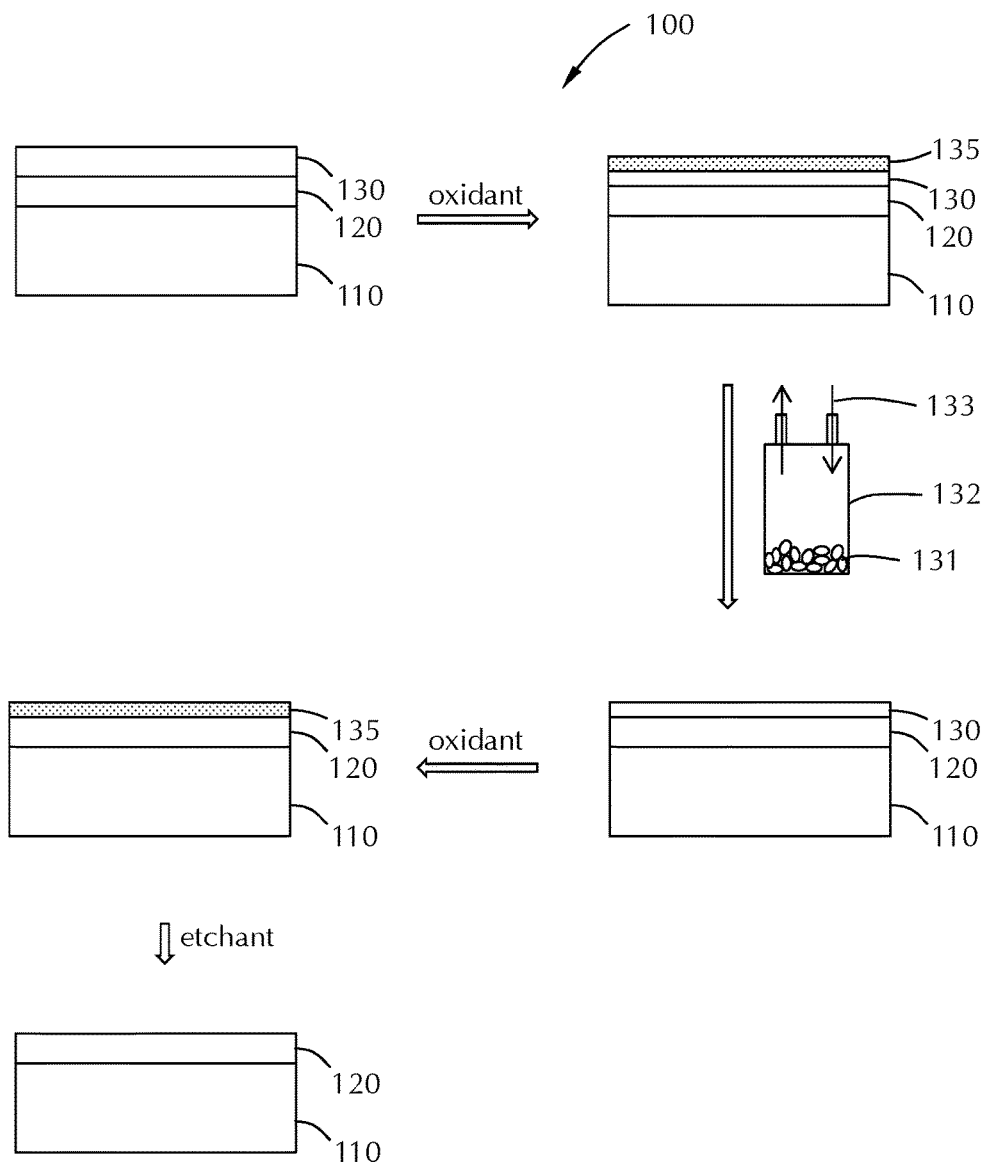
FIG. 1 shows a schematic representation of a processing method in accordance with one or more embodiment of the disclosure.

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the disclosure are directed to methods for selective and layer-by-layer TaN or TiN etch. The methods can also be integrated in-situ with existing TaN or TiN deposition processes.

According to some embodiments, the metal nitride surface is formed of a thin layer of metal oxynitride by one or more of: 1) air exposure; 2) oxygen direct plasma or remote plasma source (RPS) treatment; and/or 3) oxygen or ozone thermal treatment. After the nitride film (e.g., TaN or TiN) has been treated, the surface metal oxynitride layer can be etched away by exposure to one or more appropriate precursor.

A pure metal nitride film has a significantly lower etch rate (or no etch at all) than an oxide layer. The etched film thickness can be well controlled (or even self-limited) after certain exposure time depending upon precursor chemistry and processing condition. Some embodiments of the disclosure advantageously provide different chlorine based precursors for selective etch between TaN and TiN. The TaN/TiN etch selectivity can be in the range of about 0.5 to 20, depending on the processing condition, such as precursor dosing and processing temperature, pressure, and/or time.

In some embodiments, after the first etch thickness saturation, the substrate can be re-oxidized by any suitable method. The etch can be repeated by a similar process to remove a new layer of oxynitride layer. Some embodiments advantageously provide methods to control the amount of treatment of the nitride layer to etch more material using the same etching conditions.

In addition to air exposure, the surface oxidation can also be achieved by exposing substrate to $O_2$ or ozone gas inside a chamber. The surface oxynitride thickness can be controlled by varying the oxygen exposure condition. In some embodiments, there is no vacuum break between oxynitride treatment and the following etching loop.

Some embodiments advantageously provide a treatment of a metal nitride film to result in selective etching (relative to the original metal nitride), allowing trench fill applications. In some embodiments, a direct $O_2$ plasma can be used to directionally oxidize a portion of metal nitride (e.g., TiN) where etching is targeted. An etchant can be used to reopen a pinched off trench. Further deposition can be performed to fill the trench. This dep-etch approach can repeated to deposit a seam and void free gap fill layer in a trench.

In some embodiments, parameters can be controlled to change the thickness and speed of treatment (i.e., oxidation). Parameters include, but are not limited to, plasma power, pressure, gas species used, etc. Parameters to control etch include, but are not limited to, etchant species, pressure, concentration, etc.

FIG. 1 shows a schematic representation of a selective etch method in accordance with one or more embodiment of the disclosure. A substrate 110 is provided which has at least one metal nitride film. As used in this regard the term "provided" means that the substrate is positioned in an appropriate location or environment for processing.

The embodiment shown in FIG. 1 includes metal nitride film 120 and metal nitride film 130. The metal nitride films 120, 130 can be any suitable metal nitride including, but not limited to, tantalum nitride (TaN) and titanium nitride (TiN). In some embodiments, the metal nitride film 120 comprises TiN and the metal nitride film 130 comprises TaN. In some embodiments, the metal nitride film 120 comprises TaN and the metal nitride film 130 comprises TiN. Embodiments of the disclosure allow for the selective removal of one of the TaN or TiN films from the surface of the other film.

The substrate 110 and the films 120, 130 thereon are exposed to an oxidizing agent to form a layer of metal oxynitride 135 on the surface of the metal nitride film 130. In the embodiment shown, the surface of the film 120 is not readily accessible to the oxidizing agent and will not be oxidized so that only the film 130 forms a metal oxynitride 135 layer.

In some embodiments, the metal nitride film comprises one of TaN or TiN and the substrate further comprises a metal nitride film of the other of TaN or TiN and one of the films is oxidized while the other remains substantially unaffected by the oxidizing agent. The oxidizing agent of some embodiments forms the metal oxynitride layer 135 by a self-limiting process. A self-limiting process continues reacting until all available active sites on the substrate surface (or film surface) are reacted.

In some embodiments, the metal nitride film 120 and metal nitride film 130 are both accessible to an oxidizing agent. For example, the film 120 and film 130 may be side-by-side (not shown). The oxidizing agent can be selective to one of the film materials so that only one of the film materials has a surface that is substantially oxidized. In some embodiments, the metal oxynitride layer 135 comprises tantalum oxynitride (TaON). In some embodiments, the metal oxynitride layer 135 comprises titanium oxynitride (TiON).

The oxidizing agent can be any suitable oxidizing agent including, but not limited to, air, $O_2$, $O_3$, $H_2O$, plasmas thereof or combinations thereof. In some embodiments, the oxidizing agent comprises air. In some embodiments, the oxidizing agent consists essentially of air. As used in this regard, the term "consists essentially of air" means that the oxidizing species of the oxidizing agent (i.e., not including diluent or carrier gases) make up is not less than about 95%, 98% or 99%. Air exposure is generally not a well-controlled method in semiconductor processing due to different air conditions (e.g., temperature, humidity). However, between most semiconductor processing steps, air exposure is inevitable. For the selective etch of TaON or TiON, if the etch thickness is low (e.g., <15 Å) and the precursor itself has self-limiting etch behavior, then the TaN or TiN oxidation can be performed by time-controlled air exposure, leading to one step (one chamber) less in the integration scheme. In some embodiments, the oxidizing agent comprises $H_2O$. In some embodiments, the oxidizing agent consists essentially of $H_2O$. As used in this regard, the term "consists essentially of $H_2O$" means that the oxidizing species of the oxidizing agent (i.e., not including inert, diluent or carrier gases) make up 95%, 98% or 99% of the active species on a molar basis.

After forming the metal oxynitride layer 135 on the surface of the metal nitride film 130, the metal oxynitride layer 135 is exposed to an etchant to remove the metal oxynitride layer 135. The etchant of some embodiments comprises a metal halide etchant 131. The etchant of some embodiments consists essentially of a metal halide etchant 131. As used in this regard, the term "consists essentially of a metal halide etchant" means that the specified metal halide etchant 131 species make up 95%, 98% or 99% (not including inert, diluent or carrier gas) of metal halide etchant.

In some embodiments, the metal halide etchant 131 has an etch rate for the metal oxynitride layer 135 that is greater than about 10 times the etch rate for the metal nitride film 130. Stated differently, the metal halide etchant 131 can etch the metal oxynitride layer 135 selectively over the metal nitride film 130 or the metal nitride film 120. The etch selectivity of the metal halide etchant in some embodiments is greater than or equal to about 5:1. This means that the metal halide etchant 131 can etch the metal oxynitride layer 135 five times greater than the metal nitride film 130. In some embodiments, the metal halide etchant 131 has an etch selectivity for the metal oxynitride layer 135 relative to the metal nitride film 130 greater than or equal to about 10:1, 15:1, 20:1 or 25:1. In some embodiments, the etchant comprises substantially no plasma.

In some embodiments, the metal halide etchant 131 comprises halogen atoms consisting essentially of chlorine. As used in this regard, the term "consisting essentially of chlorine" means that chlorine makes up greater than or equal to about 95%, 98% or 99% of the halogen atoms in the metal halide etchant on an atomic basis.

In some embodiments, the metal halide etchant 131 comprises one or more of $WCl_5$, $WOCl_4$ or $TaCl_5$. In some embodiments, the metal halide etchant 131 consists essentially of one or more of $WCl_5$, $WOCl_4$ or $TaCl_5$. As used in this regard, the term "consists essentially of" means that the stated species make up greater than or equal to about 95%, 98% or 99% of the metal halide on a molar basis.

The metal halide etchant 131 of some embodiments is a solid reagent contained within an ampoule 132. The ampoule 132 can be any suitable ampoule for use with semiconductor processing and may include a heater (not shown), inlet and outlet. The ampoule 132 can be configured for vapor draw using a carrier gas 133. The ampoule 132 temperature can be controlled to sublimate solid reagents so that the carrier gas 133 can draw the reagent from the ampoule 132. The carrier gas 133 of some embodiments comprises one or more of helium, nitrogen, argon, hydrogen, krypton or xenon. In one or more embodiments, the carrier gas 133 consists essentially of argon. As used in this regard, the term "consists essentially of argon" means that the carrier gas 133 is greater than or equal to about 95%, 98% or 99% argon on an atomic basis.

In some embodiments, the metal halide etchant 131 comprises $WCl_5$ and the ampoule 132 temperature is in the range of about 110° C. to about 150° C. In some embodiments, the metal halide etchant 131 comprises $WOCl_4$ and the ampoule 132 temperature is in the range of about 50° C. to about 90° C. In some embodiments, the metal halide etchant 131 comprises $TaCl_5$ and the ampoule 132 temperature is in the range of about 80° C. to about 120° C.

The exposures to the oxidizing agent and metal halide etchant 131 can be repeated to remove a predetermined amount of the metal nitride film 130. In the embodiment shown in FIG. 1, the oxidation and etching processes are shown repeating twice to remove the metal nitride film 130. However, those skilled in the art will understand that this is merely representative of one possible embodiment and that the oxidation and etching processes can be repeated any suitable number of times depending on the thickness of the film to be removed.

Figure 2:
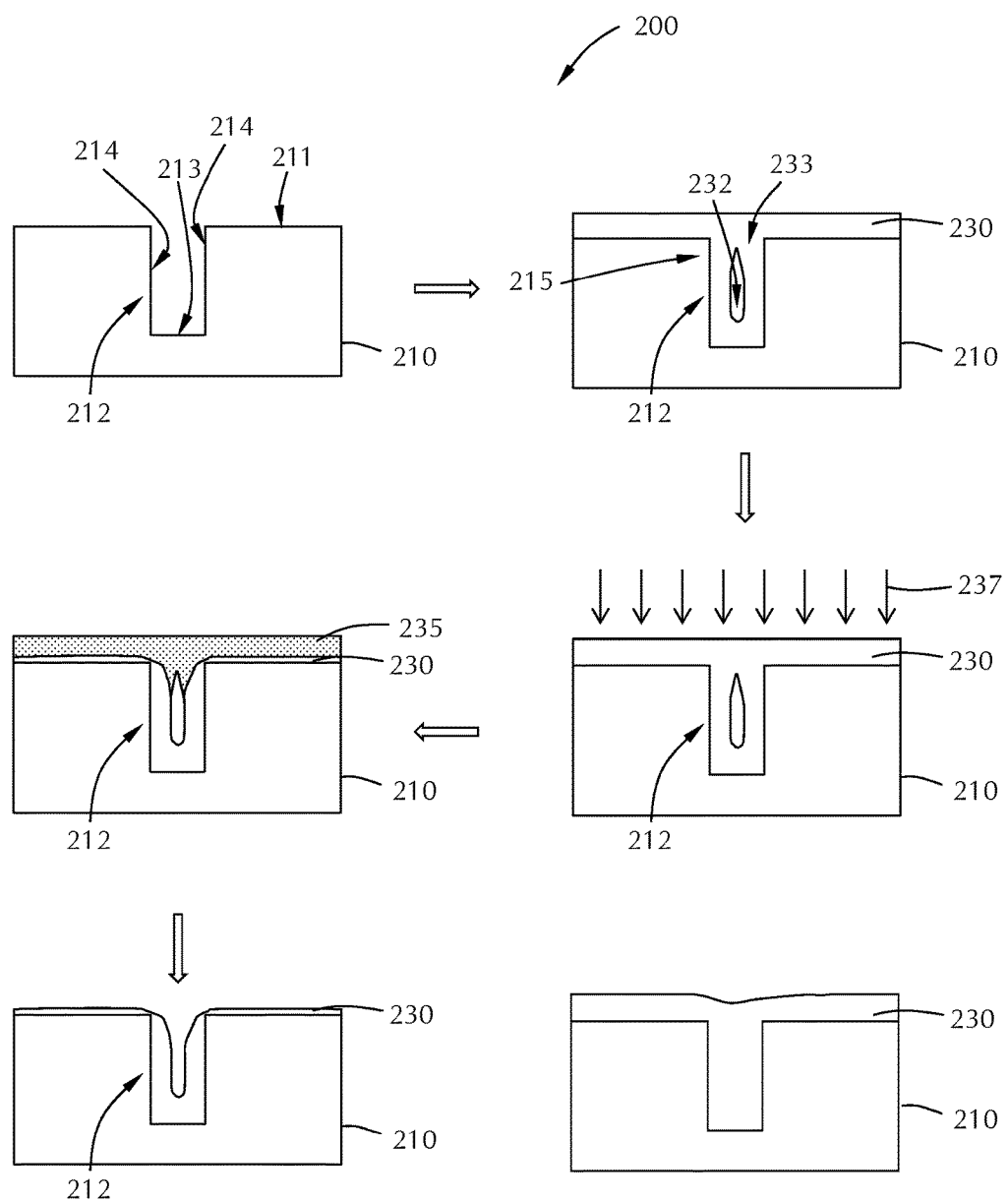
FIG. 2 shows a schematic representation of a processing method in accordance with one or more embodiment of the disclosure.

FIG. 2 shows another embodiment of a selective etch method 200 for gapfill applications. Substrate 210 has a trench 212 formed in a surface 211 of the substrate 210. While the embodiment shown includes one trench, those skilled in the art will recognize that there can be any number of trenches, vias or features that this method is applicable with. The term trench is used to describe both a trench shaped feature having an elongate axis that extends substantially parallel to the surface 211 and a via or hole-like feature that is cylindrically shaped. The trench 212 has a bottom 213 and sidewalls 214.

A metal nitride film 230 is deposited in the trench 212. The metal nitride film 230 grows in the trench so that a seam 232 forms within the trench 212. The seam 232 is any gap in the metal nitride film 230 located between the sidewalls 214 of the trench 212. The seam 232 may be roughly centered within the width of the trench 212. The seam 232 may be a distance above the bottom 213 of the trench. The metal nitride film 230 near the top 215 of the trench 212 pinches off access to the seam 232 at pinch point 233. In some embodiments, the metal nitride film 230 grows in the trench 212 to a point where the pinch point 233 interferes with reactive species reaching the gap between sidewalls without closing off access. The structure is not fully pinched-off at this point, but a constriction prevents or limits additional gapfill growth.

The metal nitride film 230 is exposed to a directional oxidation to form a metal oxynitride. For example, a directional oxidizing plasma 237 may be used. The directionality of the plasma can be controlled by applying a bias potential to the substrate or substrate support. The directional oxidization forms a metal oxynitride layer 235 near the top 215 of the trench 212.

The metal oxynitride layer 235 is exposed to a metal halide etchant to etch the metal oxynitride layer 235 from the metal nitride film 230. The directional oxidation and etching processes can be repeated to remove the pinch point 233 to allow access to the seam 232. Once the seam 232 is accessible, additional metal nitride film 230 is deposited in the trench 212 to fill the seam 232 and form a seam-free gapfill.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A selective etch method comprising:
   providing a substrate having a trench formed in a surface of the substrate, the trench having a bottom and sidewalls;
   depositing a metal nitride film in the trench so that the metal nitride film grows in the trench forming a seam within the trench and metal nitride film near a top of the trench pinches off access to the seam;
   exposing the metal nitride film to a directional oxidizing plasma to oxidize the metal nitride film near the top of the trench to form a metal oxynitride layer;
   exposing the metal oxynitride layer to a metal halide etchant to etch the metal oxynitride layer from the metal nitride film to remove the pinch off of the trench and allow access to the seam; and
   depositing additional metal nitride film in the trench to fill the seam.

2. The method of claim 1, wherein the metal nitride film comprises one or more of TaN or TiN.

3. The method of claim 1, wherein the oxidizing agent comprises one or more of air, $O_2$, $O_3$ or $H_2O$ or combinations thereof.

4. The method of claim 1, wherein the metal halide etchant comprises one or more of $WCl_5$, $WOCl_4$ or $TaCl_5$.

5. The method of claim 1, wherein the metal oxynitride layer is formed in a self-limiting process.

6. The method of claim 1, wherein the metal halide has an etch rate for the metal oxynitride layer that is greater than about 10 times the etch rate for the metal nitride film.

7. The method of claim 1, wherein the etchant comprises substantially no plasma.

8. The method of claim 1, wherein the metal halide etchant comprises halogen atoms consisting essentially of chlorine.

9. The method of claim 1, wherein exposures to the oxidizing agent and metal halide etchant are repeated to remove a predetermined amount of the metal nitride film.

10. The method of claim 4, wherein the metal halide etchant consists essentially of one or more of $WCl_5$, $WOCl_4$ or $TaCl_5$.

11. The method of claim 4, wherein the metal halide etchant is a solid contained within an ampoule configured for vapor draw using a carrier gas at an ampoule temperature.

12. The method of claim 11, wherein the metal halide etchant comprises $WCl_5$ and the ampoule temperature is in the range of about 110° C. to about 150° C.

13. The method of claim 11, wherein the metal halide etchant comprises $WOCl_4$ and the ampoule temperature is in the range of about 50° C. to about 90° C.

14. The method of claim 11, wherein the metal halide etchant comprises $TaCl_5$ and the ampoule temperature is in the range of about 80° C. to about 120° C.

* * * * *